(12) United States Patent
Honigsberg

(10) Patent No.: US 11,915,568 B2
(45) Date of Patent: Feb. 27, 2024

(54) FIRE ALERTING DEVICE AND SYSTEM

(71) Applicant: EVERSENSE SPS LTD, Tel Aviv-Jaffa (IL)

(72) Inventor: Doron Honigsberg, Petah-Tikva (IL)

(73) Assignee: EVERSENSE SPS LTD, Tel Aviv-Jaffa (IL)

( * ) Notice: Subject to any disclaimer, the term of this patent is extended or adjusted under 35 U.S.C. 154(b) by 0 days.

(21) Appl. No.: 17/854,203

(22) Filed: Jun. 30, 2022

(65) Prior Publication Data
US 2022/0335800 A1 Oct. 20, 2022

Related U.S. Application Data

(63) Continuation-in-part of application No. PCT/IL2020/051369, filed on Dec. 31, 2020.
(Continued)

(51) Int. Cl.
*G08B 17/06* (2006.01)

(52) U.S. Cl.
CPC .................................. *G08B 17/06* (2013.01)

(58) Field of Classification Search
CPC ...... G08B 17/06; G08B 17/10; G08B 17/005; G08B 25/14; G08B 25/009; G08B 25/10
See application file for complete search history.

(56) References Cited

U.S. PATENT DOCUMENTS

| 10,762,758 | B2 * | 9/2020 | Balaji | ................... | G08B 29/145 |
| 2003/0112145 | A1 * | 6/2003 | Allen | ..................... | G08B 17/06 |
| | | | | | 340/584 |

(Continued)

FOREIGN PATENT DOCUMENTS

| AU | 2013245429 A1 | 6/2014 |
| CN | 211529280 U | 9/2020 |

(Continued)

OTHER PUBLICATIONS

Thermoelectric Energy Havesting for Forest Fire Detection using Global Positioning System : (Pang Sze Kooi) Jun. 20, 2017.*
(Continued)

*Primary Examiner* — Hoi C Lau
(74) *Attorney, Agent, or Firm* — CANTOR COLBURN LLP

(57) ABSTRACT

The present disclosure discloses a device for detecting and alerting of a fire at the vicinity thereof. The device is deployed in an area at the outdoors, e.g. a forest, that is desired to be monitored. The device has two main parts, a first part that is intended to remain relatively cold and therefore is thermally isolated from the environment. The first part can be isolated by being inserted into a static object in the desired area, e.g. a trunk of a tree, or a rock, or, in some embodiments, can be surrounded by a thermal-isolating material. The first part is thermally connected to a first end of a thermoelectric generator (TEG) unit and a second part of the device, a hot part, is thermally connected to a second end of the TEG unit. The second part is intended to be thermally exposed to the ambient environment such that in case of a fire in the vicinity of the device, the second part is heated to high temperatures while the first part remains relatively cold since it is thermally isolated. Therefore, the second part causes the second end of the TEG unit to heat to high temperatures while the first end of the TEG unit remains relatively cold since it is thermally connected to the thermally-isolated first part that may be considered to function as a heat sink. The temperature difference between the two ends of the TEG unit generates an electrical energy, e.g. a voltage difference that is supplied to an alerting unit in the device. The alerting unit is inactive as long as there is no generated electrical energy by the TEG unit and become active only when the temperature difference reaches a cer-
(Continued)

tain value. Upon being activated by the electrical energy of the TEG unit, the alerting unit is configured to transmit an alerting signal indicative of the location of the fire. The alerting signal is received by a receiving station and triggers operation of fire fighters for extinguishing the fire quickly.

21 Claims, 6 Drawing Sheets

Related U.S. Application Data

(60) Provisional application No. 62/955,574, filed on Dec. 31, 2019.

(56) References Cited

U.S. PATENT DOCUMENTS

| | | | | |
|---|---|---|---|---|
| 2007/0056850 A1* | 3/2007 | Ye | ................. | C23C 14/3407 |
| | | | | 204/298.12 |
| 2007/0212263 A1* | 9/2007 | Shin | .................. | G01N 27/16 |
| | | | | 422/95 |
| 2007/0262477 A1* | 11/2007 | Brown | ................ | B60H 3/0007 |
| | | | | 222/146.2 |
| 2008/0135081 A1* | 6/2008 | Sharifi | ................. | B64D 37/06 |
| | | | | 136/207 |
| 2014/0036951 A1* | 2/2014 | Caroff | ................. | H10N 10/01 |
| | | | | 374/29 |
| 2019/0287363 A1* | 9/2019 | Balaji | ................. | G08B 25/009 |
| 2022/0335800 A1* | 10/2022 | Honigsberg | ......... | A62C 3/0271 |

FOREIGN PATENT DOCUMENTS

| | | |
|---|---|---|
| CN | 111968333 A | 11/2020 |
| JP | 2014187101 A | 10/2014 |
| JP | 2019159459 A | 9/2019 |
| RU | 2682421 C1 | 3/2019 |
| RU | 2689633 C1 | 5/2019 |

OTHER PUBLICATIONS

International Search Report for corresponding application PCT/IL2020/051369 filed Dec. 31, 2020; dated Apr. 19, 2021.

Pang Sze Ko, "Thermoelectric Energy Harvesting for Forest Fire Detection Using Global Positioning System (GPS)", Jun. 20, 2017.

Written Opinion for corresponding application PCT/IL2020/051369 filed Dec. 31, 2020; dated Apr. 19, 2021.

* cited by examiner

FIRE ALERTING DEVICE AND SYSTEM

CROSS REFERENCE TO RELATED APPLICATION

This application is a continuation-in-part of International Patent Application Number PCT/IL2020/051369 filed on Dec. 31, 2020, which claims priority to U.S. Provisional Patent Application No. 62/955,574 filed on Dec. 31, 2019, both of which said applications are incorporated herein by reference in their entirety.

TECHNOLOGICAL FIELD

The present disclosure is in the field of fire detection and alerting devices, in particular for the outdoors.

BACKGROUND ART

References considered to be relevant as background to the presently disclosed subject matter are listed below:
RU2689633
AU2013245429
JP2019159459
RU2682421

Acknowledgement of the above references herein is not to be inferred as meaning that these are in any way relevant to the patentability of the presently disclosed subject matter.

BACKGROUND

Wildfire in natural environment, e.g. forests, savannas, or jungles, became a major problem in the recent years. Early detection of fire with its exact location is crucial for obtaining control fast while the fire dimensions are still relatively small. Therefore, a solution for early detecting and alerting of a fire that can cover any desired area will assist for obtaining control of a fire in relatively short times.

GENERAL DESCRIPTION

The present disclosure discloses a device for detecting and alerting of a fire at the vicinity thereof. The device is deployed in an area at the outdoors, e.g. a forest, that is desired to be monitored. The device has two main parts, a first part that is intended to remain relatively cold and therefore is thermally isolated from the environment. The first part can be isolated by being inserted into a static object in the desired area, e.g. a trunk of a tree, or a rock, or, in some embodiments, can be surrounded by a thermal-isolating material. The first part is thermally connected to a first end of a thermoelectric generator (TEG) unit and a second part of the device, a hot part, is thermally connected to a second end of the TEG unit. The second part is intended to be thermally exposed to the ambient environment such that in case of a fire in the vicinity of the device, the second part is heated to high temperatures while the first part remains relatively cold since it is thermally isolated. Therefore, the second part causes the second end of the TEG unit to heat to high temperatures while the first end of the TEG unit remains relatively cold since it is thermally connected to the thermally-isolated first part that may be considered to function as a heat sink. The temperature difference between the two ends of the TEG unit generates an electrical energy, e.g. a voltage difference that is supplied to an alerting unit in the device. The alerting unit is inactive as long as there is no generated electrical energy by the TEG unit and become active only when the temperature difference reaches a certain value. Upon being activated by the electrical energy of the TEG unit, the alerting unit is configured to transmit an alerting signal indicative of the location of the fire. The alerting signal is received by a receiving station and triggers operation of fire fighters for extinguishing the fire quickly.

A first aspect of the present disclosure provides an outdoors fire alerting device. The device includes a first part and a second part spaced apart from one another by a thermoelectric generator unit. The first part is being thermally isolated from its surrounding environment in order to keep it isolated from direct fire either by (i) being shaped for insertion into, and optionally retained within, a static object, such that portions of the object surround that part such that it is not exposed to the ambient environment, or by (ii) being surrounded by a thermally-isolating material. The second part is intended for being exposed to the ambient environment, in order to be exposed to direct fire, while the first part is thermally isolated from the environment, e.g. retained within the static object. The first part, the second part and the thermoelectric generator unit are integrally coupled to one another forming together a single structure. The thermoelectric generator unit is configured to generate electrical energy in response to a temperature difference between the first part and the second part, i.e. when the second part is being heated by fire while the first part remains relatively cool.

The device further includes an alerting unit that is electrically coupled to the thermoelectric generator unit and configured to transmit, e.g. by a signal transmitting unit, a signal indicative of fire alert when the temperature difference between the first and the second part reaches a predefined value. The signal may be of any kind of electromagnetic signal, e.g. a cellular signal, RF signal, satellite beacon or any other suitable signal.

In some embodiments of the device, the first part is elongated along a first axis and is extending away from the second part.

In some embodiments of the device, the first part has a generally cylindrical shape. The first part may have a circular cross section or at times a rectangular or oval cross section.

In some embodiments of the device, the alerting unit includes a transmitting element, e.g. an antenna. In some embodiments, the transmitting element is being external to the first part. A protecting cover is typically surrounding the transmitting element for protecting it, namely thermally isolating it while allowing the transmission of the signal. The protecting cover is made of a material that is configured to allow the transmission of the alerting signal, e.g. polycarbonate or polyurethane cover/coating.

In some embodiments of the device, the transmitting element is attached or being integral with the second part such that it is exposed to the environment to allow the transmission of the alerting signal without any interfering medium. The transmitting element may be disposed at a top portion of the second part that is intended to be higher from the ground than a bottom portion and therefore shielded, at least partially, from extensive heat that comes from the ground direction in case of fire on the ground.

In some embodiments of the device, the transmitting element is embedded within a thermally isolating layer that is attached to the TEG unit and/or to the first or second parts. The isolating layer is configured to allow the transmission of the alerting signal therethrough.

In some embodiments of the device, the second part is configured for transmitting the signal being generated by the alerting unit. In other words, the second part, or parts thereof is also serving as an antenna that transmits the alerting signal or the second part comprises an antenna element for transmitting the alerting signal. Thus, the second part is made of one or more materials capable of (i) reaching high temperatures sufficient to obtain the required temperature difference while (ii) still functional as an antenna for transmitting the alerting signal generated by the alerting unit.

In some embodiments of the device, the second part comprises a heat absorbing section and an antenna section. The TEG unit is configured to generate electrical energy in response to a temperature difference between the first part and the heat absorbing section of the second part. The antenna section is configured for transmitting the alerting signal. The heat absorbing section and said antenna section are separated by a thermal isolating material.

In some embodiments of the device, the heat absorbing section is a proximal section located proximal to the TEG unit or the first part, and the antenna section is a distal section.

In some embodiments of the device, the antenna section is a top or upper section located at a top or upper portion of the second part and the heat absorbing section is a bottom or lower section located at a bottom or lower portion of the second part.

In some embodiments of the device, the top section is confined only a partial portion of the top end of the second part such that it is thermally shielded by other portions of the second part in case of a fire.

In some embodiments of the device, the antenna section is located at an upper and proximal portion of the second part and has no thermal contact with any heat absorbing material. In the instance that the second part is formed of a circular top that is defined by a width profile and a diameter, and a pillar portion that links to the TEG unit, the antenna section is located at a portion of the second part that has no contact with the pillar portion. Furthermore, the antenna part is confined to only partial of the width of the circular top.

In some embodiments of the device, the heat absorbing section and the antenna section are made of different materials. The heat absorbing section is made of a material that is capable of absorbing a great amount of heat to increase significantly its temperature, and the antenna section is made of conductive material capable of transmitting the alerting unit. Furthermore, the antenna section may be covered or coated by a thermally-isolating material for preventing its damaging by extensive heat.

In some embodiments of the device, the second part comprises a proximal section, proximal to the TEG unit or the first part, and a distal section that includes the tip of the device. The proximal and distal sections are separated by a thermal isolating material. The distal part is configured to allow transmission of the alerting signal generated by the alerting unit and the proximal part is configured to be heated upon exposure to fire to a temperature sufficient to result in the generation of electrical energy by the TEG due to the temperature difference from the first part.

In some embodiments of the device, the proximal section and the distal section are made of two different materials.

In some embodiments of the device, the distal section is made of conductive material covered or coated with a thermal isolating material that is transparent for the electromagnetic radiation that carries the alerting signal. Thus, the antenna functionality of the distal section is maintained while being thermally protected by the thermally isolating cover/coating.

In some embodiments of the device, the first part is made of a material having thermal properties different than the second part. For example, the first part may be formed of material having higher heat capacity and/or higher thermal conductivity than that of the second part.

In some embodiments of the device, the second part is formed of two or more sections of different materials that differ from one another by their thermal properties. In some embodiments, the distal section, namely the section that is the most distanced from the TEG unit is formed of a material having the highest heat capacity to allow a relatively large amount of heat to flow from sections that are in the vicinity of the TEG unit towards the farthest section from the cold part of the TEG unit to accumulate therein. Sections that thermally connects the distal section with the proximal section, namely the section that is in direct thermal contact with the TEG unit, may be formed of materials having high thermal conductivity for allowing efficient conduction of heat from the proximal section to the distal section. It is to be noted that the second part may include a plurality of sections formed of materials having different thermal properties, the selection of the material for each section is made so as to allow flow of heat from the TEG unit or the proximal section towards the distal section.

In some embodiments, the first part is axial symmetric around the first axis. It is to be noted that in some embodiments, the second part may also be axial symmetric around an axis, typically around the first axis.

In some embodiments, the second part defines an insertion limiter configured to physically limit the insertion of the device into said static object, i.e. to limit the insertion of the device to a certain distance within the object.

In some embodiments of the device, the second part is axial symmetric and has a rim of a diameter larger than that of the first part. By this configuration portions of the second part are being the insertion limiter.

In some embodiments, the device is having a generally mushroom-like shape, i.e. the first part is being the pillar and the second part is being the wide, circular top. This shape grants the device suitable characteristics to allow the first part being inserted within an object in the field and the second part to protrude from the object and being exposed to the environment and to be heated in case of a fire.

In some embodiments of the device, the signal is a unique device-specific signal, namely the signal identifies a specific device out of a plurality of deployed devices and carries data of attributes that are specific for the device that transmitted the signal.

In some embodiments of the device, the signal includes data indicative of the position of the device.

In some embodiments of the device, the alerting unit comprises an identification module embedded therein that is capable of being connected to a plurality of communication networks, e.g. cellular networks. For example, the identification module may be in the form of an eSIM or SIM. In the instance that the identification module is embedded in the alerting unit, such as in the case of an eSIM, the requirement of a SIM slot is obsolete. Thus, the risk of foreign objects or moisture to enter into the device via such slots is eliminated.

In some embodiments of the device, the alerting unit is configured to transmit the signal upon reaching a temperature difference between the first and second part of at least 70° C., 80° C., 90° C., 100° C., 110° C., 120° C., 130° C., 140° C. or 150° C.

In some embodiments, the device includes a cooling unit in thermal connectivity with the first part and/or a cold end of the TEG unit. The cooling unit is configured for undergoing endothermic reaction, e.g. a chemical endothermic reaction, upon being exposed to a certain temperature value that triggers the reaction.

In some embodiments of the device, the cooling unit includes two compartments, e.g. two plastic bags. The first compartment includes a first reactant and the second compartment includes a second reactant. The two reactants are separated from one another, namely each is being held by the respective compartment and remain inactive as long as they are separated. Once the cooling unit exceeds a certain value of temperature, the separation of the compartments is being consumed by the heat of the fire, i.e. the plastic bags are melted, the two reactants are mixed to react in an endothermic reaction that cools the first part.

In some embodiments of the device, the second part is configured to be transitioned between a non-TEG-contacting state, namely a state in which the second part is not in physical and/or thermal contact with the TEG unit, and a TEG-contacting state, namely a state in which the second part is in physical and/or thermal contact with the TEG unit. The transition of the second part to the TEG-contacting state is performed upon the second part exceeds a transition temperature value, e.g., a temperature that causes the second part to extend until it is in physical contact with the TEG unit.

In some embodiments, the device includes a power source, e.g. a battery for supplying power for transmitting periodic status signals of the device. Namely, an efficient power source of the device is configured to supply energy once in every predetermined amount of time, e.g. once a month or once a year, for transmitting a health-check. It is to be noted that the status signal may be transmitted from the alerting unit, e.g. from its transmitting element, or in some other embodiments from a dedicated antenna.

Yet another aspect of the present disclosure provides a fire alerting system. The system includes a plurality of fire alerting devices according to any of the embodiments described above, each device is deployed at a different location in the desired area to be monitored. The system further includes a processing circuitry that is configured to receive the signal indicative of fire alert from any one of the fire alerting devices and extract location data of the fire from the signal.

In some embodiments of the system, the processing circuitry is configured for analyzing two or more signals signal indicative of fire alert from at least two fire alerting devices and extract location data of the fire from the signals. The location data includes the progressing direction of the fire and/or the speed of its progression. For example, sequential alerts derive from several alerting devices, may indicate the progression of the fire and its speed of progression according to the geographical locations of the alerting devices.

In some embodiments of the system, the processing circuitry is further configured to transmit the location data to an output unit, e.g. a mobile device, tablet, central control system, etc. The location data is configured such that it may be presented over a map in the output unit and/or provide guiding instructions to a suggested location at the vicinity of the fire in order to deal with the fire. The guiding instructions may include alternatives for means for approaching the fire, e.g. by driven vehicle or by aerial vehicle.

In some embodiments, the system includes an output unit for outputting the location data, i.e. presenting the location of the fire to user.

In some embodiments, the system includes one or more receiving units, e.g. cellular antennas, that are configured to receive said signal indicative of fire alert and transmit it to the processing circuitry. In some embodiments, the signal is received by the receiving unit and transmitted to a single server that includes the processing circuitry. The processing circuitry processes the signal and sends alerts to the relevant forces at the ground, according to any configuration set by the system admin.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 1A is an exploded view; FIG. 1B is a side view; and FIG. 1C is a perspective view.

DETAILED DESCRIPTION OF EMBODIMENTS

Figure 1A:
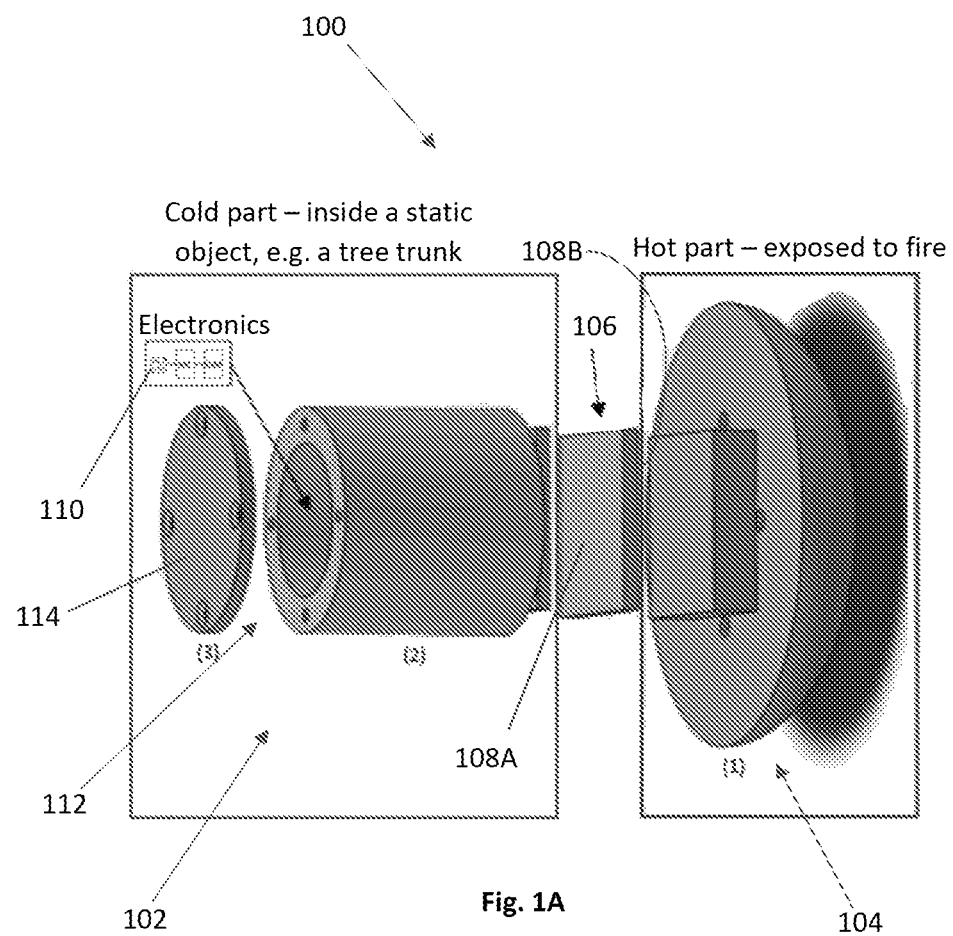
FIGS. 1A-1C are schematic illustrations of different views of a non-limiting example of an embodiments of the device of the present disclosure.
Figure 1B:
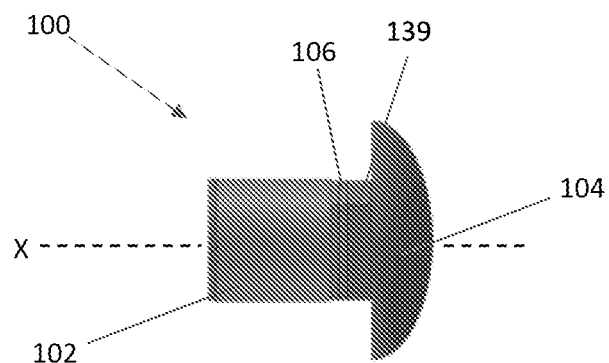
Figure 1C:
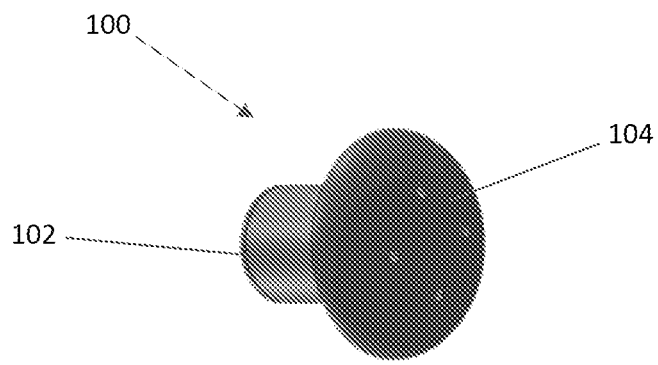

Reference is first made to FIGS. 1A-1C, which are schematic illustration of different views a non-limiting example of the device of the present disclosure. The device 100 includes a first, cold part 102 and a second, hot part 104 that are spaced apart from one another by a thermoelectric generator (TEG) unit 106. The first part 102 is in thermal connectivity with a first end 108A of the TEG unit 106 and the second part 104 is in thermal connectivity with a second end 108B of the TEG unit 106. The first part 102 is shaped to be inserted into a static object, e.g. a tree trunk, a wooden object or any other object that has an interior volume that is isolated from the environment. The first part 102, the second part 104 and the TEG unit 106 constitute together an integral structure, namely the first and the second parts are coupled to two opposite ends of the TEG unit.

The first part 102 is intended for being thermally isolated from the environment by portions of the static object that surround it. While the first part is surrounded by a static isolating object, the second part 104 is exposed to the ambient environment such that in case of a fire, e.g. a wild fire in a forest, the second part 104 is heated by the fire and reaches temperatures that are much higher than the first part 102. Since the first part 102 and the second part 104 are in thermal connectivity with opposite sides/ends of the TEG unit 106, a temperature difference is developed between different portions of the TEG unit 106, which generates an electrical energy, i.e. a voltage difference, that is used for operating electric-based components of the device that are configured for transmitting an alert of fire when supplied with electrical energy. These electric-based components constitute an alerting unit 110 of the device that is inactive as long as a temperature difference between two ends of the TEG unit 106 is below a certain value. Once the temperature difference exceeds this certain value, the alerting unit 110 becomes active and transmit a signal that carries data indicative of the fire and its location. It is to be noted that the alerting unit 110 includes a transmitting element (not shown), e.g. cellular transmitting antenna that is configured to transmit the alerting signal towards a receiving antenna. The transmitting antenna is typically disposed external to the metal parts, and in some embodiments may be embedded in a thermally isolating layer that is attached to the first part 102 and/or the TEG unit 106. For example, the signal may be unique for each device, namely carrying identifying data of the specific device. The location of each device that is deployed in the outdoors is mapped during or before its deployment such that if an identifying signal from a specific device is received by a signal receiving station, it is associated with its pre-known exact location indicating the location of the fire in real time. The mapping of the locations of each unit is performed, for example, during the deployment of the devices. Each device includes a unique QR code and when it is being inserted into a static object at the outdoors, the QR code is being scanned by a device with an accurate positioning system such that the specific device and its exact position are being correlated and the correlation data is being stored in a memory, e.g. in a server.

In other embodiments, the alerting unit 110 may include a real-time positioning unit that once the alerting device is being activated, is configured for acquiring real-time position of the device and the alerting unit 110 transmits a signal that carries data of the real-time location of the fire.

The alerting unit 110 resides in the first part 102 such that in case of a fire near the device, the alerting unit 110 relatively thermally isolated from the fire by the static object and is not damaged by the great heat that the second part 104 is exposed to. The alerting unit may be disposed at or at the vicinity of the distal end 112 of the first part 102 such that it is located at the most thermally isolated part of the device and is most protected from overheating.

The first part 102 is sealed at its distal end 112 by a sealing member 114, e.g. a planar member that seals the alerting unit within the interior of the first part 102.

The second part 104 may be made of material that has a relatively low heat capacity to permit the temperature thereof to rise relatively quick when it is exposed to great hit such as fire. However, according to the desired design, the second part 104 may also be made of material that has a relatively high heat capacity in order to remain the temperature steady for a long time. The first part 102 and the second part 104 are typically made of the same material. However, in some embodiments, the first part 102 may be made of a material having higher heat capacity or higher thermal conductivity than that of the second part 104 to allow a quick cooling of the first end 108A of the TEG unit 106 in case of fire at the vicinity of the static object.

As can be best seen in FIG. 1B, the first and second parts 102 and 104 are attached to two sides of the TEG unit 106. The first and second parts 102 and 104 are symmetric around axis X and the first part 102 is relatively elongated with respect to the second part 104, which is relatively flattened. The device 100 has a mushroom-like shape, as can be best seen in FIG. 1C, wherein the first part is being the pillar of the mushroom and the second part is being the circular flattened top. It is to be noted that the second part 104 also includes a short pillar portion 139 that links to the TEG unit 106.

In the figures throughout the application, like elements of different figures were given similar reference numerals shifted by the number of hundreds corresponding to the number of the respective figure. For example, element 200 in FIG. 2 serves the same function as element 100 in FIGS. 1A-1C.

Figure 4:
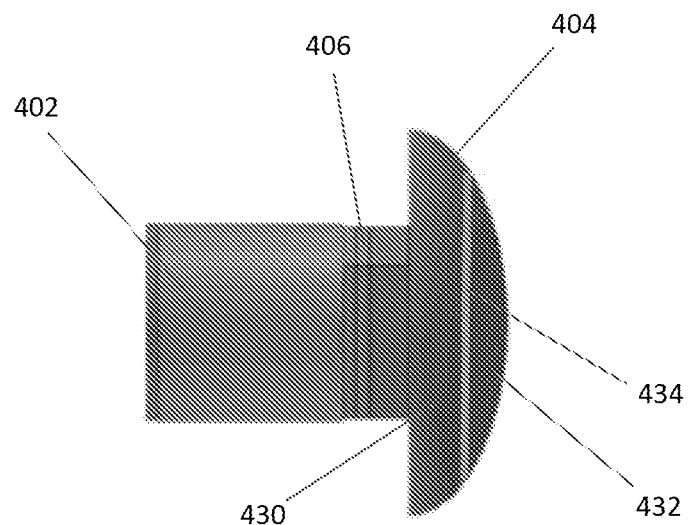
FIG. 4 is a schematic illustration of a side view of a non-limiting example of an embodiment of the device of the present disclosure.

FIG. 4 is a schematic illustration of a non-limiting example of the device according to an embodiment of the present disclosure, which differs from the device exemplified in FIGS. 1A-1C by that the second part is divided into two sections, a proximal section 430 and a distal section 432. The second part 404 includes a proximal section 430 that is in thermal connectivity with the TEG unit 406. The proximal section 430 is configured (e.g. made of suitable material) to be heated by exposure to an external heat, such as wildfire, to reach a temperature difference from the first part 402, thereby resulting in the generation of electrical energy by the TEG unit 406. The distal section 432 is separated from the proximal section 430 by a thermally isolating material 434, thus allowing the proximal section 430 to be heated while the distal section 432 maintains relatively cold. The distal section 432 is being the transmitting element of the alerting unit, i.e. serving as an antenna for transmitting the alerting signal. Optionally, the distal section 432 is covered or coated with a thermally isolating material, similar or different than that separating the proximal and the distal sections.

Figure 5A:
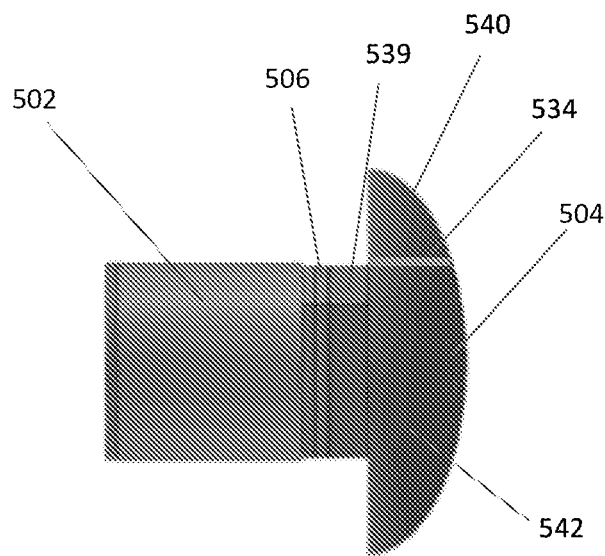
FIGS. 5A-5B are schematic illustrations of a side view of non-limiting examples of embodiments of the device of the present disclosure.
Figure 5B:
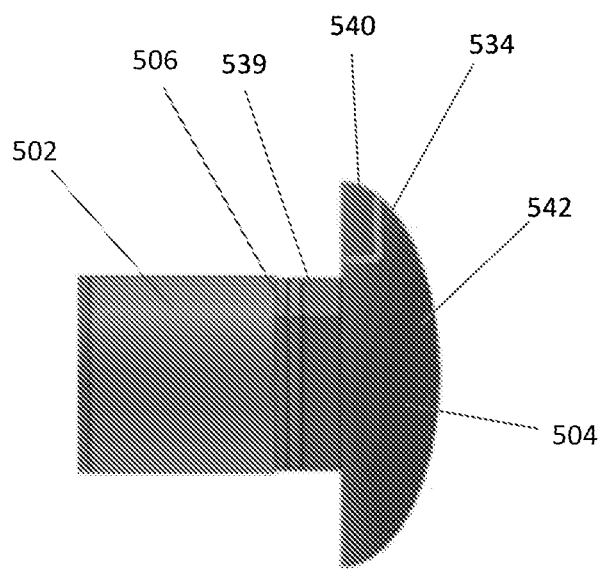

FIGS. 5A-5B are another schematic illustrations of non-limiting examples of the device according to an embodiment of the present disclosure, which differs from the device exemplified in FIGS. 1A-1C by that the second part is divided into two sections, a top section 540, and a bottom section 542. The top section 540 is intended to be further to the ground than the bottom section 542 when inserted or installed in an object. The bottom section 542 is in thermal connectivity with the TEG unit 506. The bottom section 542 is configured (e.g. made of suitable material) to be heated by exposure to an external heat, such as wildfire, to reach a temperature difference from the first part 502, thereby resulting in the generation of electrical energy by the TEG unit 506. The top section 540 is separated from the bottom section 542 by a thermally isolating material 534, thus allowing the bottom section 542 to be heated while the top section 540 maintains relatively cold. The top section 540 is confined into a segment of the second part that does not overlap with the pillar portion 539 of the second part 504, namely the top section 540 has no physical contact with the pillar portion 539 of the second part that links to the TEG unit 506. In FIG. 5A the top section 540 is defined over the full width of the second part 504 and in FIG. 5B the top section 540 is defined only at the proximal portion of the second part 504 that is proximal to the pillar portion 539 (but does not overlap therewith). The top section 540 is being the transmitting element of the alerting unit, i.e. serving as an antenna for transmitting the alerting signal. Optionally, the top section 540 is covered or coated with a thermally isolating material, similar or different than that separating the proximal and the distal sections.

Figure 2:
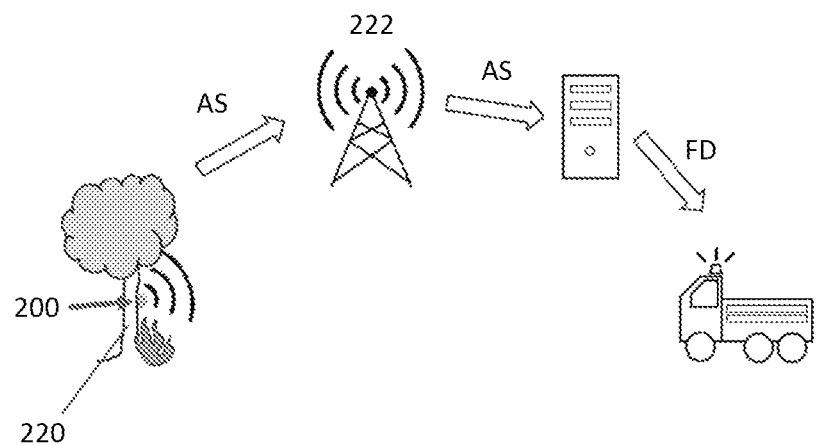
FIG. 2 is a schematic illustration of a non-limiting example presenting data flow during operation of the system of the present disclosure.

FIG. 2 is a schematic illustration of a non-limiting example of a system according to an aspect of the present disclosure and the data flow therein. The figure illustrates a device 200 of the present disclosure that is installed within a static object 220 in the outdoors, in this example a tree. Upon a break of fire at the vicinity of the device 200, a temperature difference between the first and second parts of the device is developed, which results in electrical energy that is supplied to the alerting unit by the TEG unit of the device. The alerting unit transmits an alerting signal AS that is received by a receiving antenna 222, e.g. a cellular antenna, and then transmitted to a processing circuitry 224 or a server that is configured to analyze the alerting signal AS and extract the location of the fire therefrom. It is to be noted that the location of the signal may be derived according to any one of the following: (i) correlating a device-identification data in the signal with a pre-known location of the device; (ii) analyzing the reception signal received in a plurality of antennas and extract the estimated location based thereon, e.g. triangulation; (iii) extracting location data from the signal that is obtained from a positioning system, e.g. GPS of the device, or any combination thereof.

Once the location is being extracted from the alerting signal AS, the processing circuitry transmits fire data FD indicative of the location of the fire to fire-fighting forces interface(s) for directing them to the fire. The fire data FD may include any one of the following: the location of the fire, guiding instructions to the fire, a recommended optimal location for deployment to fight the fire, a recommended vehicle to use for fighting the fire, i.e. land vehicle or aerial vehicle according to the topography of the location of the fire, etc.

Figure 3A:
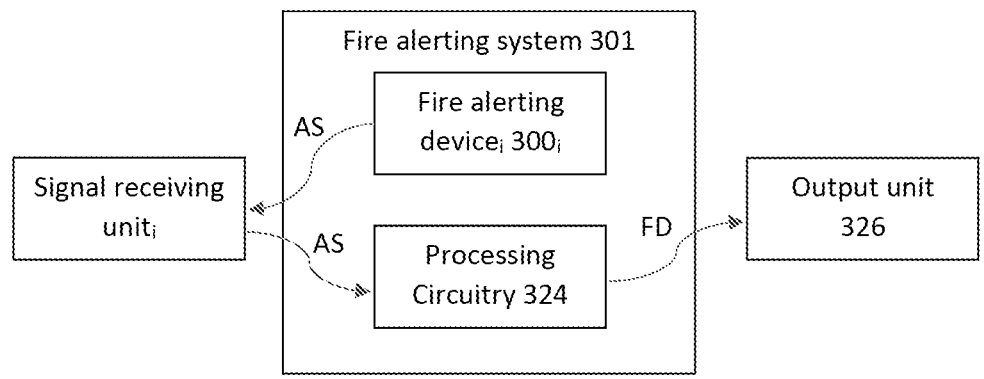
FIGS. 3A-3B are block diagrams of non-limiting examples of embodiments of a system according to the present disclosure.
Figure 3B:
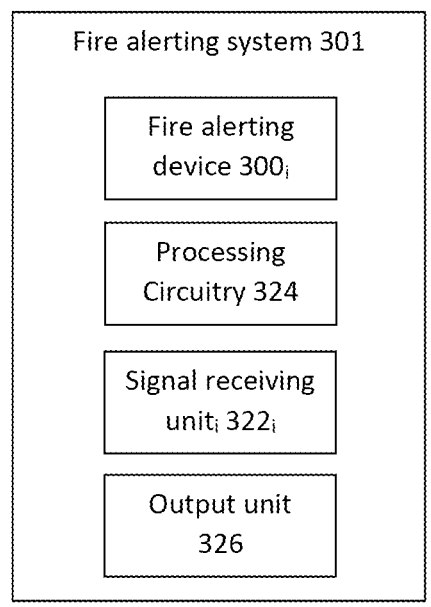

FIGS. 3A-3B are block diagrams of non-limiting examples of a system according to embodiments of the present disclosure. FIG. 3A shows a fire alerting system 301 that includes a plurality of fire alerting device $300_i$ of the present disclosure. Upon detection of fire by the device, it is configured to transmit an alerting signal AS that is received by one or more signal receiving units $322_i$, e.g. cellular antennas or dedicated antennas. The alerting signal AS is then transmitted to a processing circuitry 324 that analyzes the signal, extract the location of the fire therefrom and generate fire data FD indicative of the location. The processing circuitry is configured to transmit the fire data FD to an output unit 326, e.g. a mobile device, tablet, computer or a control center that operates security forces. The fire data FD can be displayed over a map in the output unit 326 and may include guiding instructions for approaching the fire, e.g. a suggested approaching direction in view of topographical constrains and/or other detected fire locations.

The embodiment of the system in FIG. 3B differs from that of FIG. 3A by that the system in FIG. 3B includes the signal receiving unit 322; and the output unit 326 such they are part of the system.

The invention claimed is:

1. An outdoors fire alerting device, comprising
a first part and a second part spaced apart from one another by a thermoelectric generator unit, the first part being shaped for insertion into a static object and the second, exposed part intended for being exposed to the ambient environment while the first part is retained within the static object; the first part, the second part and the thermoelectric generator unit being integrally coupled to one another;
the thermoelectric generator unit being configured to generate electrical energy in response to a temperature difference between the first part and the second part;
an alerting unit electrically coupled to the thermoelectric generator unit and configured to transmit a signal indicative of fire alert when the temperature difference between the first and the second part reaches a pre-defined value;
wherein the first part is made of a material having thermal properties different than the second part.

2. The device of claim 1, wherein the first part has a generally cylindrical shape and is elongated along a first axis, wherein the first part is axial symmetric about the first axis.

3. The device of claim 1, wherein the second part defines an insertion limiter configured to physically limit the insertion of the device into said static object.

4. The device of claim 1, wherein the second part is axial symmetric and has a rim of a diameter larger than that of the first part.

5. The device of claim 1, wherein said signal is a unique device-specific signal; and
wherein the signal comprises data indicative of the position of the device.

6. The device of claim 1, wherein the alerting unit is configured to transmit the signal upon reaching a temperature difference between the first and second part of at least 70° C.

7. The device of claim 1, comprising a cooling unit in thermal connectivity with the first part and/or a cold end of the TEG unit, the cooling unit is configured for undergoing endothermic reaction upon being exposed to a certain temperature value and cool the first part.

8. The device of claim 7, wherein the cooling unit comprises a first compartments holding a first reactant and a second compartment holding a second reactant, wherein the first reactant is separated from the second reactant by a partition that is configured to be consumed upon being exposed to a certain temperature value.

9. The device of claim 1, wherein the second part comprises one or more sections, each section is made of a different material having different thermal properties.

10. The device of claim 9, wherein a section that is more distanced from the TEG unit is having higher heat capacity with respect to a more proximate section; and
wherein a section that is more distanced from the TEG unit is having lower thermal conductivity with respect to a more proximate section.

11. The device of claim 1, wherein the alerting unit comprises a transmitting antenna element embedded within a bulk of thermally-isolating material, said bulk is attached to the external of the first part and/or the TEG unit.

12. The device of claim 1, wherein the second part comprises an antenna member or is configured for functioning as an antenna member for transmitting the signal being generated by the alerting unit.

13. The device of claim 1, wherein the second part comprises a heat absorbing section and an antenna section, the TEG unit being configured to generate electrical energy in response to a temperature difference between the first part and the heat absorbing section of the second part, the antenna section is configured for transmitting the alerting signal;
wherein the heat absorbing section and the antenna section are made of different materials.

14. The device of claim 13, wherein the heat absorbing section is being a proximal section located proximal to the TEG unit or the first part, and the antenna section is being a distal section.

15. The device of claim 13, wherein the antenna section is being a top section located at a top portion of the second part and the heat absorbing section is being a bottom section located at a bottom portion of the second part.

16. A fire alerting system, comprising
a plurality of devices according to claim 1; and
a processing circuitry configured to receive said signal indicative of fire alert and extract location data of the fire from the signal.

17. The fire alerting system of claim 16, wherein the processing circuitry further configured to transmit the location data to an output unit;

wherein the fire alerting system further comprising an output unit for outputting the location data.

18. The fire alerting system of claim 16, comprising one or more receiving units configured to receive said signal indicative of fire alert and transmit it to the processing circuitry.

19. The fire alerting system of claim 16, wherein the processing circuitry is configured for analyzing two or more signals signal indicative of fire alert of at least two fire alerting devices and extract location data of the fire from the signals, wherein the location data comprises at least one of progressing direction of the fire and/or the speed of its progression.

20. An outdoors fire alerting device, comprising
a first part and a second part spaced apart from one another by a thermoelectric generator unit, the first part being shaped for insertion into a static object and the second, exposed part intended for being exposed to the ambient environment while the first part is retained within the static object; the first part, the second part and the thermoelectric generator unit being integrally coupled to one another;
the thermoelectric generator unit being configured to generate electrical energy in response to a temperature difference between the first part and the second part;
an alerting unit electrically coupled to the thermoelectric generator unit and configured to transmit a signal indicative of fire alert when the temperature difference between the first and the second part reaches a pre-defined value; and
wherein the second part comprises one or more sections, each section is made of a different material having different thermal properties.

21. An outdoors fire alerting device, comprising
a first part and a second part spaced apart from one another by a thermoelectric generator unit, the first part being shaped for insertion into a static object and the second, exposed part intended for being exposed to the ambient environment while the first part is retained within the static object; the first part, the second part and the thermoelectric generator unit being integrally coupled to one another;
the thermoelectric generator unit being configured to generate electrical energy in response to a temperature difference between the first part and the second part;
an alerting unit electrically coupled to the thermoelectric generator unit and configured to transmit a signal indicative of fire alert when the temperature difference between the first and the second part reaches a pre-defined value; and
a cooling unit in thermal connectivity with the first part and/or a cold end of the TEG unit, the cooling unit is configured for undergoing endothermic reaction upon being exposed to a certain temperature value and cool the first part;
wherein the cooling unit comprises a first compartments holding a first reactant and a second compartment holding a second reactant, wherein the first reactant is separated from the second reactant by a partition that is configured to be consumed upon being exposed to a certain temperature value.

* * * * *